(12) United States Patent
Wu

(10) Patent No.: US 9,655,278 B2
(45) Date of Patent: May 16, 2017

(54) SLIM FAN STRUCTURE

(71) Applicant: ASIA VITAL COMPONENTS CO., LTD., New Taipei (TW)

(72) Inventor: Chun-Ming Wu, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 368 days.

(21) Appl. No.: 14/296,461

(22) Filed: Jun. 5, 2014

(65) Prior Publication Data
US 2015/0354585 A1 Dec. 10, 2015

(51) Int. Cl.
| | | |
|---|---|---|
| F04D 19/00 | (2006.01) |
| F04D 29/40 | (2006.01) |
| H05K 7/20 | (2006.01) |
| F04D 17/04 | (2006.01) |
| F04D 25/06 | (2006.01) |
| G06F 1/20 | (2006.01) |

(52) U.S. Cl.
CPC ......... H05K 7/20172 (2013.01); F04D 17/04 (2013.01); F04D 25/0613 (2013.01); G06F 1/203 (2013.01)

(58) Field of Classification Search
CPC .... F04D 17/04; F04D 29/403; F04D 29/4226; F04D 25/0613; G06F 1/203; H05K 7/20172; H05K 7/20136
See application file for complete search history.

(56) References Cited

U.S. PATENT DOCUMENTS

| | | | | |
|---|---|---|---|---|
| 3,695,775 A * | 10/1972 | Zenkner | ................. | F04D 17/04 415/119 |
| 3,809,503 A * | 5/1974 | Schlicker | ............ | F04D 25/0646 392/365 |
| 6,111,748 A * | 8/2000 | Bhatia | .................... | F04D 17/04 165/122 |
| 7,688,579 B2 * | 3/2010 | Hwang | ................... | F04D 17/04 165/104.33 |
| 8,974,194 B2 * | 3/2015 | Yin | .................... | F04D 25/0606 417/420 |

(Continued)

FOREIGN PATENT DOCUMENTS

| | | |
|---|---|---|
| CN | 102536860 A | 7/2012 |
| TW | M491095 U | 12/2014 |

Primary Examiner — Dwayne J White
Assistant Examiner — Peter T Hrubiec
(74) Attorney, Agent, or Firm — C. G. Mersereau; Nikolai & Mersereau, P.A.

(57) ABSTRACT

A slim fan structure includes a fan frame, a top cover closed to a top of the fan frame to define a receiving space in the fan frame, a stator assembly mounted in the receiving space, and a hub fitted around the stator assembly. The fan frame has opposite first and third sides forming an air inlet and an air outlet, respectively, and opposite second and fourth sides having a first and a second side wall formed thereon, respectively. The first side wall includes a protruded portion laterally extended toward the air inlet, and the second side wall includes a stop portion located adjacent to the air outlet. With the air inlet and the air outlet formed on two lateral sides of the fan frame, the slim fan structure has an effectively reduced overall thickness and does not produce noise during operation to largely upgrade the operational performance thereof.

3 Claims, 9 Drawing Sheets

(56) References Cited

U.S. PATENT DOCUMENTS

| | | | |
|---|---|---|---|
| 8,974,195 B2* | 3/2015 | Horng | F04D 17/04 |
| | | | 415/203 |
| 2012/0057966 A1 | 3/2012 | Chen et al. | |
| 2012/0207596 A1* | 8/2012 | Chou | F04D 29/4226 |
| | | | 415/224 |
| 2012/0294713 A1* | 11/2012 | Horng | F04D 17/04 |
| | | | 415/208.1 |

\* cited by examiner

SLIM FAN STRUCTURE

FIELD OF THE INVENTION

The present invention relates to a fan structure, and more particularly to a slime fan structure that has a reduced overall thickness and produces less noise during operation to largely upgrade the fan's operational performance.

BACKGROUND OF THE INVENTION

Thanks to the rapid development of the electronic industry, the currently available electronic products now have electronic elements with largely upgraded performance and increased computing speed. However, with the constantly increased number and computing speed of chips inside the electronic elements, heat produced by these chips during operation thereof also increases. The heat produced by the working chips must be timely removed from the electronic elements, lest it should adversely affect the performance of the electronic elements to result in lowered computing speed thereof. Further, the electronic elements are subject to burn-out when the heat accumulates without being timely removed from the electronic elements. Therefore, it has already become an important issue to effectively dissipate heat from the electronic elements. Currently, the use of a cooling fan is one of the most common ways of heat dissipation.

In a very limited system space, a small-sized centrifugal fan is frequently used as a cooling fan. FIGS. 1A, 1B and 1C illustrate a conventional centrifugal fan 1, which includes a fan frame 11, a top cover 12, a hub 13, and a plurality of blades 14 circumferentially spaced on an outer surface of the hub 13. The fan frame 11 is provided on a bottom with a lower air inlet 111, and the top cover 12 is closed onto a top of the fan frame 11 and provided with an upper air inlet 121. The assembled fan frame 11 and top cover 12 together define an air outlet 112 that is located on a lateral open side of the fan frame 11. The hub 13 and the blades 14 spaced thereon are mounted on the bottom of the fan frame 11 to locate between the fan frame 11 and the top cover 12. When the hub 13 rotates, the blades 14 are caused to rotate synchronously. At this point, external air is caused to flow into the centrifugal fan 1 via the lower air inlet 111 and the upper air inlet 121 in a direction parallel to the hub 13. The air axially flowing into the fan frame 11 then flows in a radial direction relative to the hub 13 before it finally flows out of the fan frame 11 via the air outlet 112.

In designing the centrifugal fan 1, an upper and a lower air-in space must exist above and below the hub 13, respectively. In other words, the upper air-in space is provided between the top cover 12 and the hub 13 and the blades 14, and the lower air-in space is provided between the fan frame 11 and the hub 13 and the blades 14. These air-in spaces inevitably increase an overall thickness of the centrifugal fan 1, preventing the same from having a slim design. On the other hand, omission of the air-in spaces would have adverse influence on the operational performance of the centrifugal fan 1. Moreover, with the air inlets 111, 121 formed on the bottom of the fan frame 11 and the top cover 12, increased noise will be produced when the hub 13 and the blades 14 rotate.

In brief, the conventional centrifugal fan has the following disadvantages: (1) uneasy to realize a slim design thereof; (2) having adverse influence on the fan's operational performance; and (3) tending to produce increased noise during fan operation.

It is therefore tried by the inventor to develop a slim fan structure that overcomes the disadvantages of the conventional centrifugal fan.

SUMMARY OF THE INVENTION

To overcome the disadvantages of the conventional centrifugal fan, it is a primary object of the present invention to provide a slim fan structure that has effectively reduced overall thickness and upgraded operating performance.

Another object of the present invention is to provide a slim fan structure that enables effectively reduced noise during fan operation.

To achieve the above and other objects, the slim fan structure according to the present invention includes a top cover, a fan frame, a stator assembly and a hub. The top cover is closed onto a top of the fan frame, so that a receiving space is defined between the top cover and the fan frame. The fan frame includes a shaft holder located in the receiving space, and has a first side, a second side located adjacent to the first side, a third side located opposite to the first side, and a fourth side located opposite to the second side. The first side has an air inlet formed thereon and the third side has an air outlet formed thereon. The second side is formed with a first side wall, and the fourth side is formed with a second side wall. The first side wall includes a laterally protruded portion extended toward the air inlet, and the second side wall includes a stop portion located adjacent to the air outlet. The stator assembly is mounted in the receiving space and fitted around the shaft holder, and the hub is mounted in the receiving space and fitted around the stator assembly. The hub includes a plurality of radially outward extended extension portions, an annular connection portion connected to radially outer ends of the extension portions, and a plurality of blades arranged on the connection portion to circumferentially space from one another. The radially outward extended extension portions respectively have an extension length larger than a blade length of each of the blades. With the air inlet and the air outlet formed on two opposite lateral sides of the fan frame, the slim fan structure of the present invention does not require air-in spaces in a thickness direction thereof and can therefore have an effectively reduced overall thickness to enable a slim design while ensuring upgraded operational performance. Meanwhile, since there are not openings provided on the top and the bottom of the slim fan structure for serving as air inlets, no or only reduced noise will be produced during fan operation.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
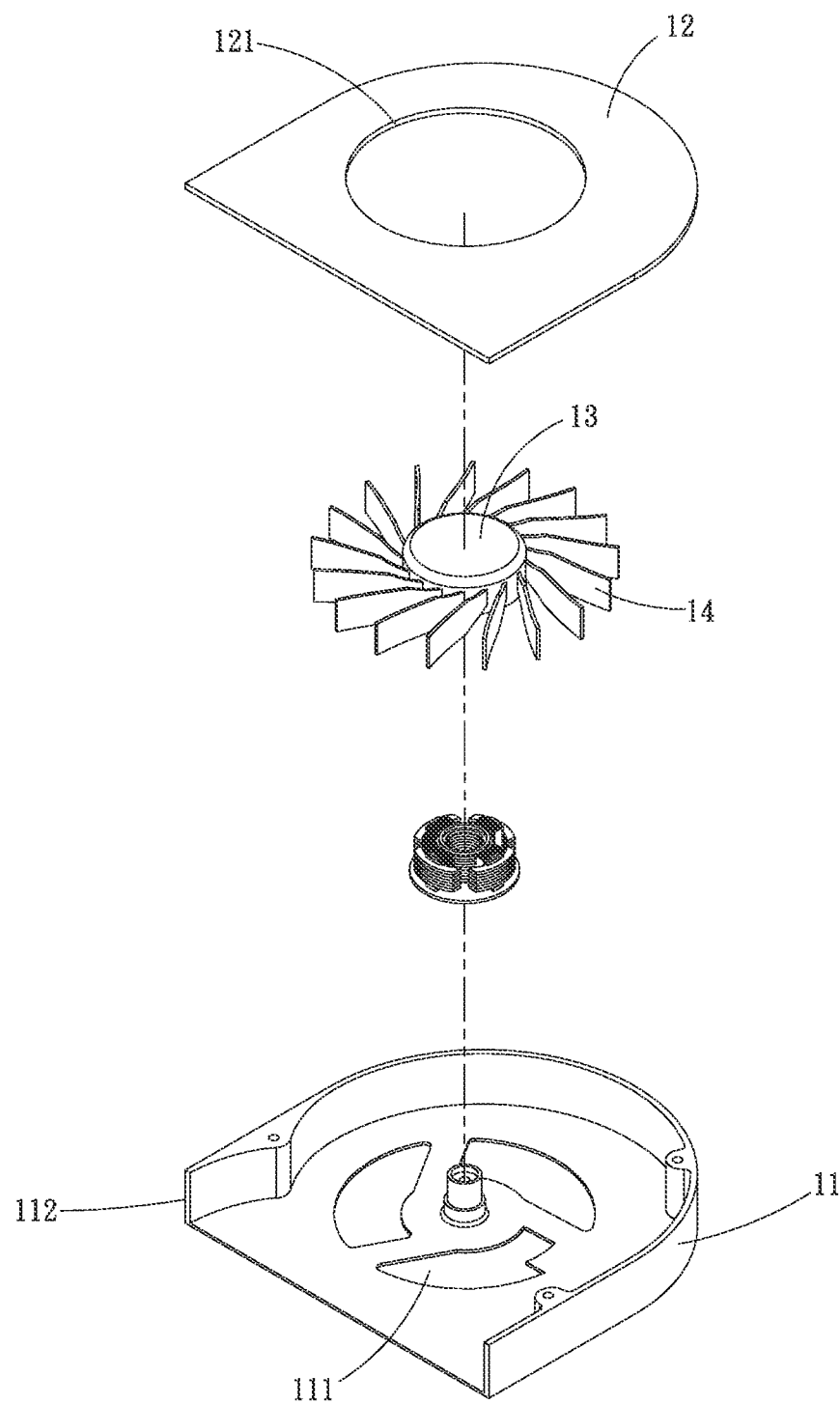
FIG. 1A is an exploded perspective view of a conventional centrifugal fan for use in a limited system space.
Figure 1B:
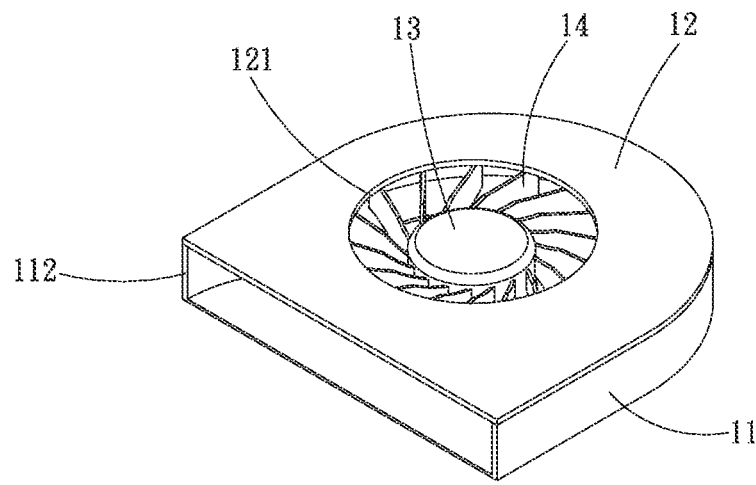
FIG. 1B is an assembled view of FIG. 1A.
Figure 1C:
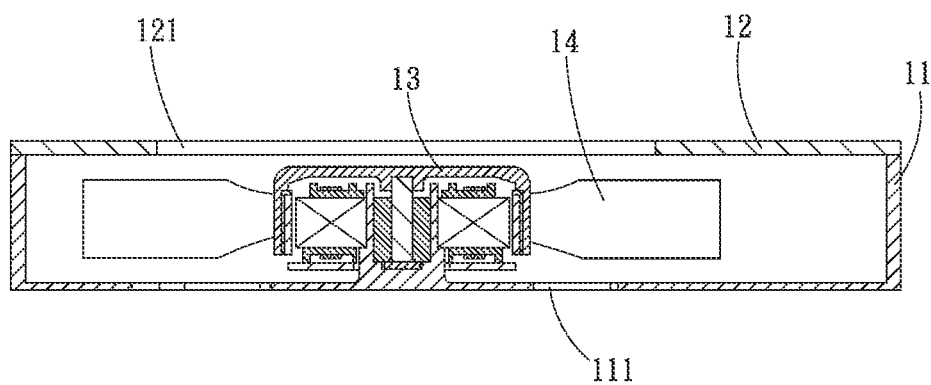
FIG. 1C is a sectional view of FIG. 1B.

The present invention will now be described with some preferred embodiments thereof and with reference to the accompanying drawings. For the purpose of easy to understand, elements that are the same in the preferred embodiments are denoted by the same reference numerals.

Figure 2:
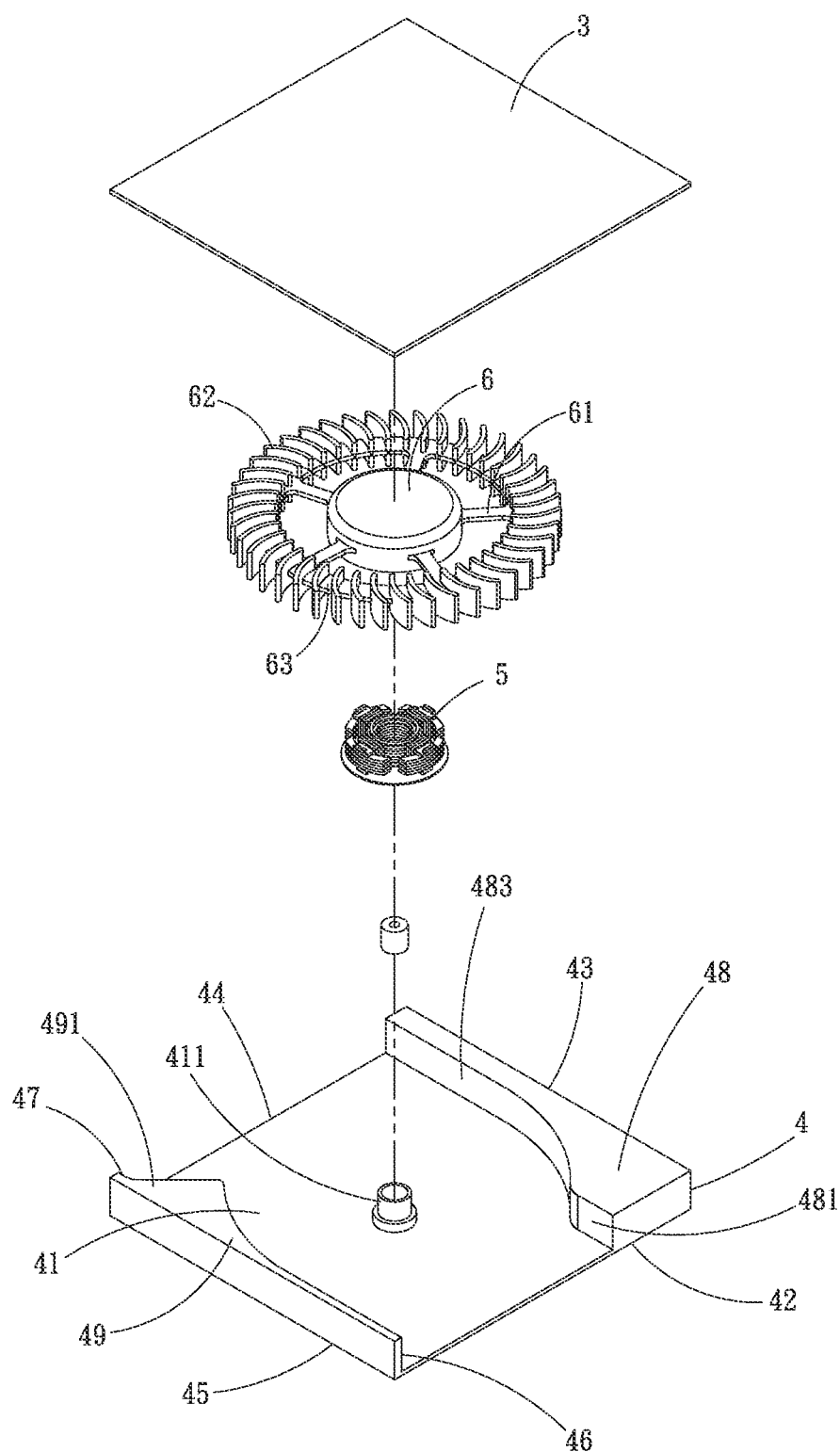
FIG. 2 is an exploded perspective view showing a slim fan structure according to a first preferred embodiment of the present invention.
Figure 3:
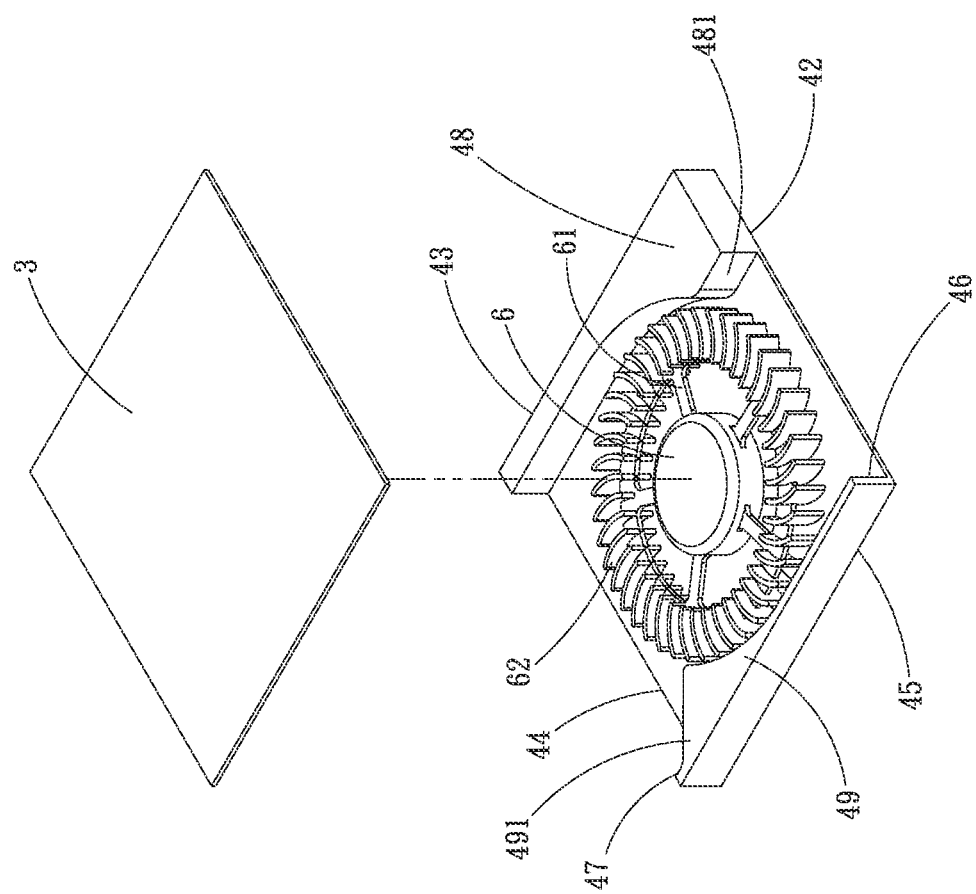
FIG. 3 is a partially assembled view of FIG. 2.
Figure 4:
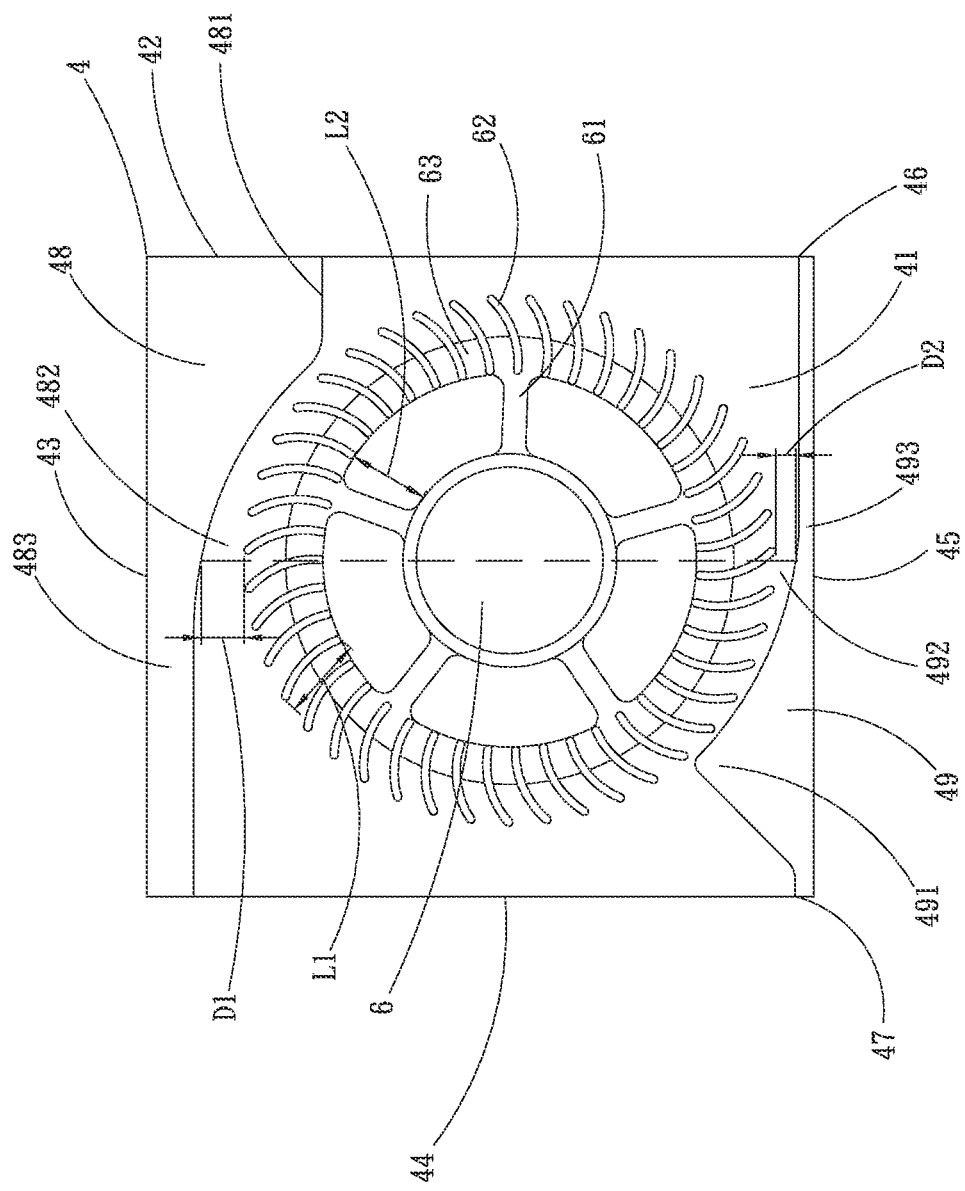
FIG. 4 is a plan view of the slim fan structure according to the first preferred embodiment of the present invention, with a top cover removed therefrom.

Please refer to FIGS. 2, 3 and 4, wherein FIG. 2 is an exploded perspective view showing a slim fan structure 2 according to a first preferred embodiment of the present invention, FIG. 3 is a partially assembled view of FIG. 2, and FIG. 4 is a plan view of the slim fan structure 2 of FIG. 3 with a top cover 3 removed therefrom. As shown, the slim fan structure 2 in the first preferred embodiment includes a top cover 3, a fan frame 4, a stator assembly 5, and a hub 6.

The top cover 3 is closed onto a top of the fan frame 4, so that a receiving space 41 is defined between the top cover 3 and the fan frame 4. The fan frame 4 includes a shaft holder 411 located in the receiving space 41 near a center thereof, and has a first side 42, a second side 43 located adjacent to the first side 42, a third side 44 located opposite to the first side 42, and a fourth side 45 located opposite to the second side 43. An air inlet 46 is formed on the first side 42 of the fan frame 4, and an air outlet 47 is formed on the third side 44. Further, a first side wall 48 is provided along the second side 43, and includes a laterally protruded portion 481 extended from the first side wall 48 toward the air inlet 46 and a first extended portion 483 located between the protruded portion 481 and the air outlet 47. On the other hand, a second side wall 49 is provided along the fourth side 45, and includes a stop portion 491 located adjacent to the air outlet 47 and a second extended portion 493 located between the stop portion 491 and the air inlet 46.

The stator assembly 5 is mounted in the receiving space 41 and fitted around the shaft holder 411. The hub 6 is also mounted in the receiving space 41 and fitted around the stator assembly 5. The hub 6 includes a plurality of radially outward extended extension portions 61. An annular connection portion 63 is connected to radially outer ends of the extension portions 61 to locate around the hub 6. A plurality of blades 62 is provided on the annular connection portion 63 to circumferentially space from one another, such that the extension portions 61 are indirectly connected to the blades 62 via the annular connection portion 63. Every blade 62 has a straight blade length L1 defined between a radially outer end and a radially inner end of the blade 62. In the illustrated first preferred embodiment, the extension portions 61 are respectively radially extended from the hub 6 to the annular connection portion 63 and respectively have an extension length L2 defined between the hub 6 and the annular connection portion 63. It is noted the extension length L2 is larger than the blade length L1. A portion of the receiving space 41 located between the blades 62 and the first extended portion 483 defines a first divergent space 482 and a first distance D1. On the other hand, another portion of the receiving space 41 located between the blades 62 and the second extended portion 493 defines a second divergent space 492 and a second distance D2. As can be seen from FIG. 4, the first distance D1 is a height between a line, which is a tangent line to a virtual circle defined by the radially outer ends of the blades 62 and is close and parallel to the second side 43 of the fan frame 4, and a point, at where a normal line to that virtual circle perpendicular to that tangent line joins the first side wall 48. Similarly, the second distance D2 is a height between another line, which is another tangent line to that virtual circle and is close and parallel to the fourth side 45 of the fan frame 4, and a point, at where the normal line to that virtual circle perpendicular to that another tangent line joins the second side wall 49. According to the first preferred embodiment of the present invention, the first distance D1 is at least twice as large as the second distance D2.

Figure 5:
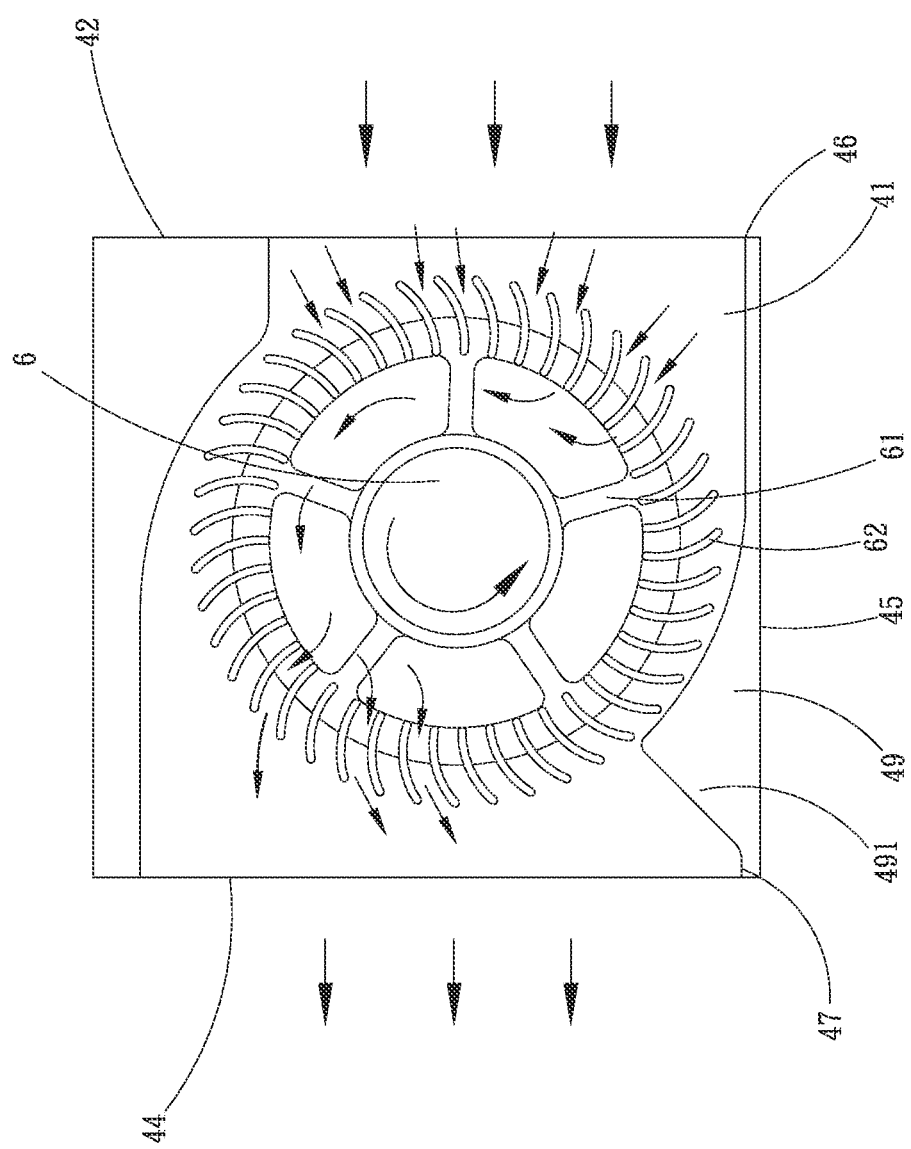
FIG. 5 shows the slim fan structure according to the first preferred embodiment of the present invention in use.

Please refer to FIG. 5 that shows the slim fan structure 2 of the first preferred embodiment in use. When the slim fan structure 2 operates, the hub 6 and the blades 62 are caused to rotate in the receiving space 41. At this point, air outside the slim fan structure 2 is drawn by the rotating blades 62 into the receiving space 41 via the air inlet 46 formed on the first side 42 of the fan frame 4. The air then flows out of the receiving space 41 via the air outlet 47 formed on the third side 44 of the fan frame 4. That is, air flows into the receiving space 41 via one lateral side of the slim fan structure 2 and then flows out of the receiving space 41 via another opposite lateral side of the slim fan structure 2. With this design, the slim fan structure 2 does not require the air-in spaces provided in the conventional centrifugal fan and can therefore have an effectively reduced overall thickness. And, since there are not openings formed on the top cover 3 and the bottom of the fan frame 4, no or only reduced noise will be produced during fan operation to enable upgraded fan operational performance. Further, when the air flows through the lateral air inlet 46 and the blades 62, the pressure of the air is boosted for a first time; and then, when the air flows through the blades 62 and a space between the hub 6 and the extension portions 61 to be thrown out of the fan frame 4 via the lateral air outlet 47, the air pressure can be boosted for a second time. The stop portion 491 formed on the second side wall 49 functions to effectively stop air from flowing backward into the fan frame 4 toward the air inlet 46. This also enables the slim fan structure 2 to provide upgraded operational performance while maintaining its slim design.

Figure 6:
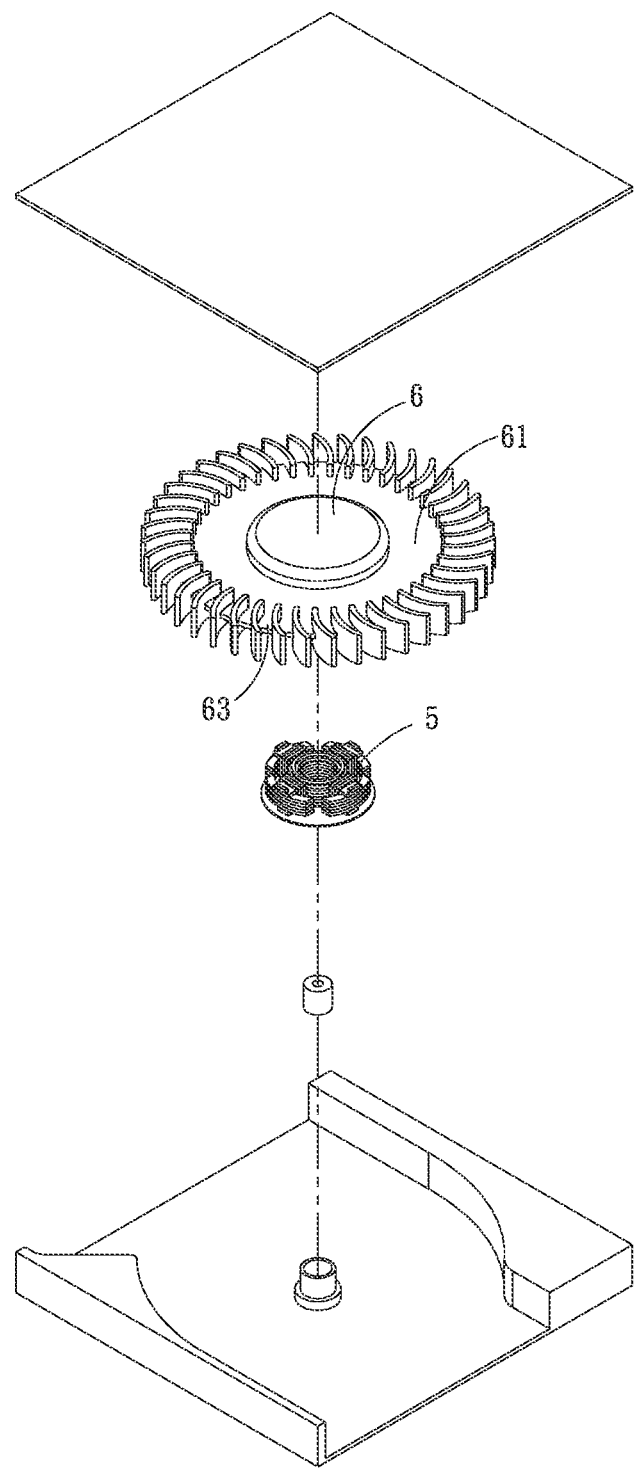
FIG. 6 is an exploded perspective view showing a slim fan structure according to a second preferred embodiment of the present invention.

FIG. 6 is an exploded perspective view of a slim fan structure according to a second preferred embodiment of the present invention. As shown, while the second preferred embodiment is generally structurally similar to the first preferred embodiment, it includes an extension portion 61 configured as a disc. The disc-shaped extension portion 61 is radially outward extended from an outer circumferential surface of the hub 6 by a predetermined distance with a radially outer periphery thereof connected to the annular connection portion 63.

Figure 7A:
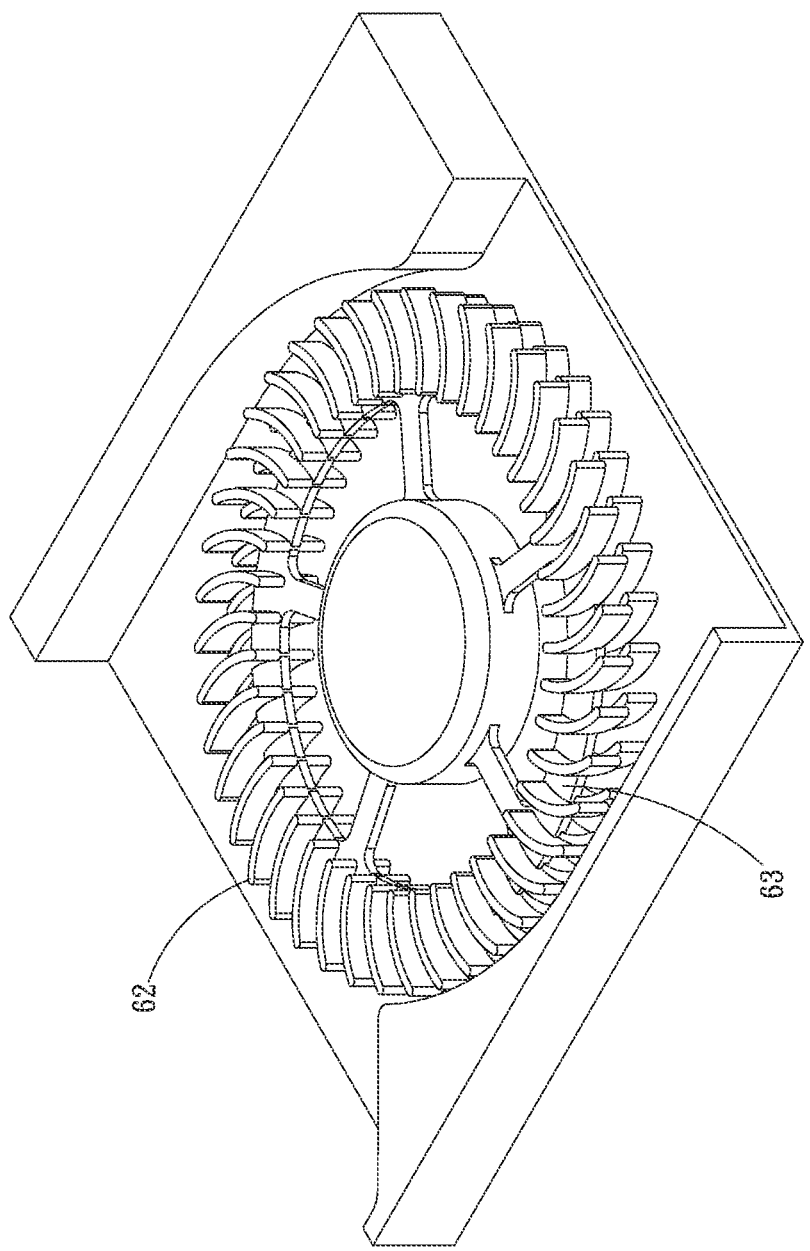
FIG. 7A is an assembled perspective view of a slim fan structure according to a third preferred embodiment of the present invention, with a top cover removed therefrom.
Figure 7B:
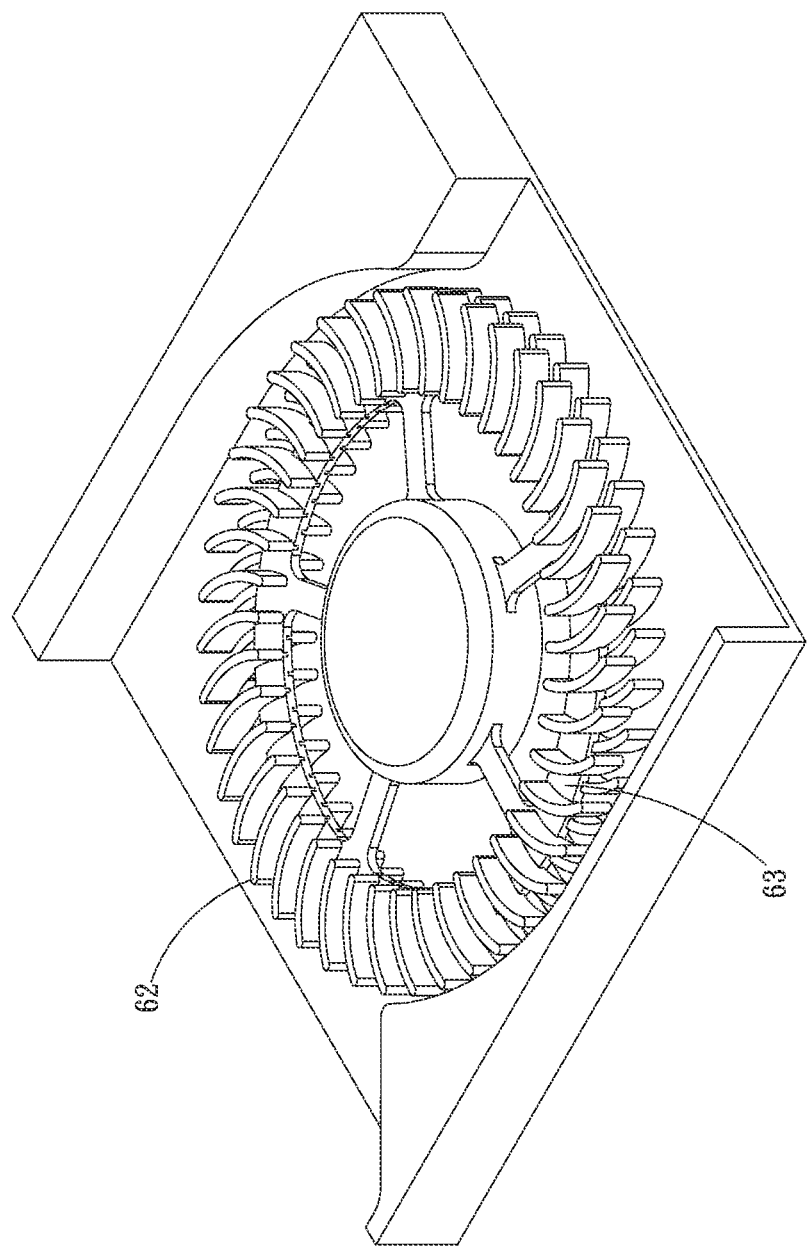
FIG. 7B shows a variant of the slim fan structure according to the third preferred embodiment of the present invention, with a top cover removed therefrom.

Please refer to FIG. 7A that is an assembled perspective view of a slim fan structure according to a third preferred embodiment of the present invention, with a top cover removed therefrom; and to FIG. 7B that shows a variant of the third preferred embodiment of the present invention. While the third preferred embodiment shown in FIG. 7A is generally structurally similar to the first preferred embodiment, the blades 62 thereof are arranged on the annular connection portion 63 in a manner different from that in the first embodiment. More specifically, in the third preferred embodiment, each of the blades 62 has a radially inner section connected to and circumferentially spaced on an upper and a lower surface of the annular connection portion 63 and a radially outer section extended beyond an outer periphery of the annular connection portion 63. The radially outer section of each blade 62 is split into an upper and a lower part, which are curved in different curvature. Therefore, the upper parts and the lower parts of the radially outer sections of the blades 62 are arranged around the annular connection portion 63 in a staggered manner. On the other hand, the variant of the third preferred embodiment shown in FIG. 7B includes a plurality of blades 62 that are alternately arranged on the upper surface and the lower surface of the annular connection portion 63. That is, some of the blades 62 are circumferentially spaced on the upper surface of the connection portion 63 while others are circumferentially spaced on the lower surface of the connection portion 63, such that the upper and the lower blades 62 are arranged in a staggered manner.

With the blades 62 arranged on the annular connection portion 63 in staggered manners, such as those provided in the third preferred embodiment and its variant, respectively shown in FIGS. 7A and 7B, the noise produced by the fan during operation thereof can be effectively reduced.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A slim fan structure, comprising:

a top cover;

a fan frame having a top closed by the top cover, such that a receiving space is defined between the fan frame and the top cover; the fan frame including a shaft holder located in the receiving space, and having a first side, a second side located adjacent to the first side, a third side located opposite to the first side, and a fourth side located opposite to the second side; the first side being formed with an air inlet, the third side being formed with an air outlet, the second side being formed with a first side wall, and the fourth side being formed with a second side wall extending along the fourth side; the first side wall including a laterally protruded portion extended from the first side wall toward the air inlet, the protruding portion being protruded from the inner of the first side wall adjacent to the air inlet to the second side wall, and the second side wall including an inward protruding stop portion located adjacent to the air outlet, the stop portion being protruded from an inner of the second side wall adjacent to the air outlet to the first side wall;

a stator assembly being mounted in the receiving space and fitted around the shaft holder; and a centrifugal fan hub being mounted in the receiving space and fitted around the stator assembly, and including a plurality of radially outward extended extension portions and a plurality of circumferentially spaced blades located around radially outer ends of the extension portions away from the centrifugal fan hub;

wherein the first side wall further includes a straight first extended portion located between the protruded portion and extending to the air outlet; and a portion of the receiving space located between the first extended portion of the first side wall and the blades defines a first divergent space and a first distance;

wherein the second side wall further includes a straight second extended portion located between the stop portion and the air inlet, the second extended portion being gradually expanding in a direction from the stop portion to the air inlet; and a portion of the receiving space located between the second extended portion of the second side wall and the blades defines a second divergent space and a second distance; and wherein the first distance is a height between a line, which is a tangent line to a virtual circle defined by radially outer ends of the blades and is close and parallel to the second side of the fan frame, and a point, at where a normal line to that virtual circle perpendicular to that tangent line joins the first side wall, and the second distance is a height between another line, which is another tangent line to that virtual circle and is closed and parallel to the fourth side of the fan frame, and a point, at where the normal line to that virtual circle perpendicular to that another tangent line joins the second side wall; and the first distance being at least twice as large as the second distance.

2. The slim fan structure as claimed in claim 1, wherein the extension portions respectively have an extension length, and the blades respectively have a blade length defined as a straight distance between a radially inner end and a radially outer end of each blade; and the extension length being larger than the blade length.

3. The slim fan structure as claimed in claim 1, wherein the hub further includes an annular connection portion connected to the radially outer ends of the extension portions to locate around the hub; and the blades being arranged on the annular connection portion to circumferentially space from one another.

* * * * *